United States Patent [19]

Leitch

[11] Patent Number: 4,933,986

[45] Date of Patent: Jun. 12, 1990

[54] GAIN/PHASE COMPENSATION FOR LINEAR AMPLIFIER FEEDBACK LOOP

[75] Inventor: Clifford D. Leitch, Coral Springs, Fla.

[73] Assignee: Motorola, Inc., Schaumburg, Ill.

[21] Appl. No.: 398,554

[22] Filed: Aug. 25, 1989

[51] Int. Cl.$^5$ ............................................. H04B 1/04
[52] U.S. Cl. .................... 455/119; 455/126; 332/162
[58] Field of Search ............... 332/155, 159, 160, 162; 375/60; 455/116, 117, 119, 126; 330/107, 278, 284, 260, 293, 84

[56] References Cited

U.S. PATENT DOCUMENTS

| | | | |
|---|---|---|---|
| 3,914,694 | 10/1975 | Shawhan | 455/126 |
| 4,481,672 | 11/1984 | Watkinson | 332/162 |
| 4,591,800 | 5/1986 | Opas | 330/293 |
| 4,610,030 | 9/1986 | Dominguez et al. | 455/126 |
| 4,641,105 | 2/1987 | Albaugh et al. | 330/260 |
| 4,696,017 | 9/1987 | Masheff et al. | 375/60 |
| 4,724,405 | 2/1988 | Matthies et al. | 332/159 |

Primary Examiner—Reinhard J. Eisenzopf
Assistant Examiner—Andrew Faile
Attorney, Agent, or Firm—Michael J. Buchenhorner

[57] ABSTRACT

A gain/phase compensation method and apparatus for a linear amplifier feedback loop in a transmitter (100). The transmitter (100) includes an input (102 or 110), a linear amplifier (143), and a modulator (142), to provide a modulator carrier-frequency output signal. The transmitter also comprises a feedback detector (154), coupled to receive the output signal and also coupled to the input. The feedback detector (120) produces a detected baseband feedback signal and applies the feedback signal to the input. The transmitter (100) of the present invention further comprises stabilizing means (118 and 130), coupled to the input (102 or 110) and to the linear amplifier (143), for reducing the open-loop gain of the linear amplifier (143) to a value lower than one for all frequencies where the feedback loop causes the phase of the baseband input signal to shift by more than 180 degrees.

10 Claims, 1 Drawing Sheet

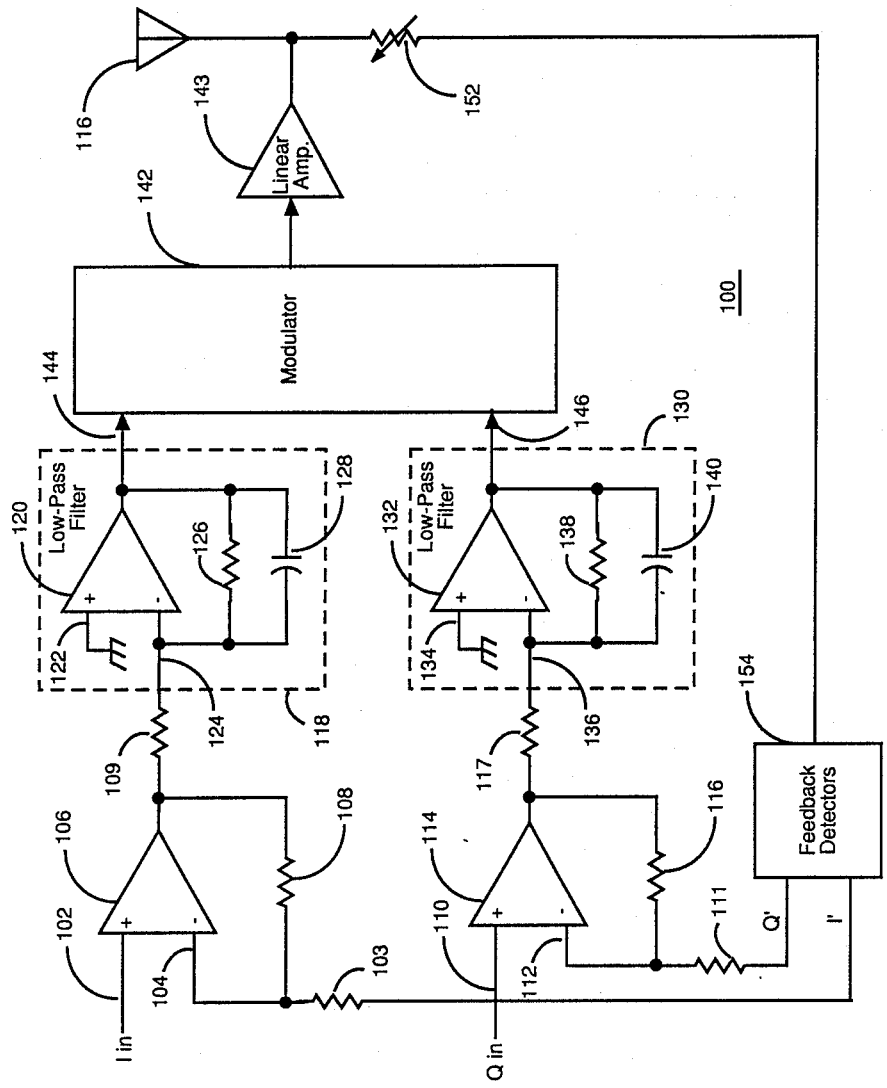

0
GAIN/PHASE COMPENSATION FOR LINEAR AMPLIFIER FEEDBACK LOOP

TECHNICAL FIELD

This invention relates generally to spectrally efficient digital modulation systems, and more particularly to stabilizing circuits for feedback carrier-frequency (CF) amplifiers.

BACKGROUND

A linear carrier-frequency amplifier (e.g., a radio-frequency (RF) amplifier) is an amplifier that increases the power of a modulated carrier signal while preserving both the amplitude and phase modulation components of the signal. Whereas, a saturating RF amplifier, commonly used in freqency-modulation (FM) radio transmitters, perserves phase modulation of the signal, but may remove or severely distort any amplitude modulation (AM) component. FM signals typically have constant amplitude, and thus, do not require linear amplification. On the other hand, future digital transmission systems may require both amplitude and phase modulation (PM) of the transmitted signals. Linear amplifiers are therefore necessary to transmit those signals.

Linear RF amplifiers commonly use feedback to control the output power. For stability (i.e., freedom from oscillation) a feedback loop must have a gain/phase versus frequency characteristic such that the open loop gain (i.e., the gain of the entire feedback loop with the loop broken at one point) is less than one at all frequencies where the phase shift around the loop is more than 180 degrees different from that at midband. Previous RF feedback loops have used high Q (i.e., the merit factor of the loop) resonant circuits at the carrier-frequency to achieve this condition. This approach has several disadvantages, including large size, a large required RF gain, and the limited amount of open loop gain possible.

SUMMARY OF THE INVENTION

Briefly, according to the invention, a transmitter is provided with an input for receiving a baseband input signal, and an output for providing a modulated carrier-frequency output signal. The transmitter comprises a modulator and a linear amplifier that provide the modulated carrier-frequency output signal.

The transmitter of the present invention includes a feedback loop comprising a feedback detector that is coupled to the output and to the input. The feedback detector receives the output signal, produces a detected baseband feedback signal, and applies the feedback signal to the input. The linear amplifier has an open loop gain.

The transmitter of the present invention also includes a stabilizing means that is coupled to the input and to the linear amplifier, for reducing the open-loop gain of the linear amplifier to a value lower than one, for all frequencies where the feedback loop causes the phase of the baseband input signal to shift by more than 180 degrees, thus preventing oscillation.

BRIEF DESCRIPTION OF THE DRAWING

The drawing illustrates a feedback circuit for a linear amplifier in accordance with the present invention.

DETAILED DESCRIPTION OF THE PREFERRED EMBODIMENT

Referring to the Drawing, a transmitter 100 with a modulator 142, a linear amplifier 143, and a feedback circuit is shown. An inphase baseband input signal ($1_{in}$) is applied to the positive input 102 of an operational amplifier 106. The amplifier 106 amplifies the difference between the input signal $1_{in}$) and the signal at its negative input 104. The output of the amplifier 106 is coupled to its negative input 104, through a resistor 108, and to a low-pass filter 118, through a resistor 109.

The low-pass filter 118 also acts as an integrator with the maximum gain limited by an optional resistor 126; it includes an operational amplifier 120 having its negative terminal 124 coupled to receive the amplified baseband signal produced by the amplifier 106 and its positive terminal 122 coupled to ground potential. The output of the amplifier 120 is coupled to its negative input 124 through the resistor 126, in parallel with a capacitor 128, to complete an integrator function.

A quadrature baseband input signal ($Q_{in}$) is applied to the positive input 110 of an operational amplifier 114. The amplifier 114 operates in substantially the same manner as the amplifier 106. Moreover, the output of the amplifier 114 is coupled to its negative input 112 through a resistor 116, and it is also applied to a low-pass filter 130, through a resistor 117. The low-pass filter 130 has substantially the same structure and operation as the low-pass filter 118.

The output of the low-pass filter 118 is applied to the inphase modulator input 144 of a conventional modulator 142. Whereas, the output of the low-pass filter 130 is applied to the quadrature modulator input 146 of the modulator 142. The modulator 142 mixes the signals ($1_{in}$) and ($Q_{in}$) in a carrier frequency, and the linear amplifier 143 amplifies the resulting low power RF signals for transmission by an antenna 116.

A sample of the RF output is mixed back down to baseband frequency by feedback detectors 154. An attenuator 152 is disposed between the output of linear amplifier 143 and the input of the feedback detectors 154, so that the power level of the feedback is lower than that of the output signal. The feedback detectors 154 product detected inphase (I') and quadrature Q') baseband signals, which are applied to the negative inputs (104 and 112) of the amplifiers 106 and 114, respectively. A resistor 103 is disposed between the negative input 104 of the amplifier 106 and the inphase output of the feedback detectors 154.

Similarly, a resistor 111 is disposed between the negative input 112 of the amplifier 114 and the quadrature output of the feedback detectors 154. The detected I' and Q' signals are combined, out-of-phase, with the input signals $1_{in}$ and $Q_{in}$ by the amplifiers 106 and 114, respectively. Thus the amplifiers 106 and 114 produce combined inphase and quadrature signals that are applied to the negative inputs of the dual low-pass filters 118 and 130, respectively, to form a negative feedback loop around the transmitter 100. The transmitter circuit 100 is stable when its open loop gain is less than one at all frequencies for which the open-loop phase shift is equal to or greater than 180 degrees. However, the open loop gain of the transmitter circuit 100 is normally greater than one because it is advantageous to make the open loop gain as high as possible since the splatter reduction (in dB) is approximately equal to the open loop gain (in dB) minus the closed loop gain (in dB).

Tuned circuits and time delays in the modulator 142 and the amplifier 143 cause phase shifts in the modulator 142 and the amplifier 143 which vary with frequency. This, in turn causes a phase error in the detected I' and Q' signals which increases with frequency. The introduction of the low-pass filters 118 and 130 reduces the open loop gain of the transmitter 100 below one, as the frequency of the combined inphase and quadrature signals increases. Therefore, oscillation is prevented.

Thus, the feedback loop uses the dual low-pass filters 118 and 130 to control the gain and phase versus frequency characteristics of the feedback loop. The filters 118 and 130 are integrators in the preferred embodiment, however, other low-pass functions can be used as well. This given the RF feedback loop flexibility and performance capability of low-pass type feedback loops without the need for high RF gain. Any amount of total open loop gain can be at baseband rather than at RF.

What is claimed is:

1. A transmitter, having an input for receiving a baseband input signal and an output for providing a carrier-frequency output signal, comprising:
   a modulator, coupled to the input, for modulating the baseband input signal and producing a carrier-frequency signal;
   a linear amplifier, coupled to the modulator, for amplifying the carrier-frequency signal and producing the carrier-frequency output signal, the linear amplifier having an open loop gain;
   a feedback loop comprising a feedback detector, coupled to receive the carrier-frequency output signal and coupled to the input, for producing a detected baseboard feedback signal and applying the detected baseband feedback signal to the input; and
   stabilizing means, coupled to the input and to the linear amplifier, for reducing the open-loop gain of the linear amplifier to a value lower then one, for all frequencies where the feedback loop causes the phase of the baseband input signal to shift by more than 180 degrees.

2. The transmitter of claim 1 wherein the stabilizing means comprises a low-pass filter.

3. The transmitter of claim 1 wherein the stabilizing means comprises an operational amplifier.

4. The transmitter of claim 2 wherein the low-pass filter is an integrator.

5. A transmitter, having input means for receiving inphase and quadrature baseband input signals, comprising:
   a modulator, coupled to receive the inphase and quadrature baseband input signals, for providing a modulated carrier-frequency signal;
   a linear amplifier, coupled to the modulator, for amplifying the modulated carrier-frequency signal and producing a carrier-frequency output signal, the linear amplifier having an open loop gain;
   a feedback loop comprising a feedback detector, coupled to receive the carrier-frequency output signal and coupled to the input means, for providing detected baseband inphase and quadrature feedback signals to the input means;
   a feedback combiner, coupler to the feedback detector for combining the detected baseband inphase feedback signal, out of phase, with the baseband inphase input signal, to provide an inphase difference signal, and for combining the detected baseband quadrature feedback signal, out of phase, with the baseband quadrature input signal to provide a quadrature difference signal; and
   stabilizing means, coupled to receive the inphase and quadrature difference signals, and coupled to the linear amplifier, for reducing the open-loop gain of the linear amplifier to a value lower than one, for all frequencies where the feedback loop causes the phase of the baseband input signal to shift by more than 180 degrees.

6. The transmitter of claim 5 wherein the stabilizing means comprises a pair of low-pass filters.

7. The transmitter of claim 5 wherein the stabilizing means comprises a pair of operational amplifiers.

8. The transmitter of claim 6 wherein each low-pass filter is an integrator.

9. a gain/phase compensation method for a linear amplifier, having an input, an output, and a feedback loop, comprising the steps of:
   (a) receiving a baseband input signal at the input;
   (b) providing a modulated carrier-frequency signal;
   (c) amplifying the modulated carrier-frequency signal to produce a carrier-frequency output signal using a linear amplifier having an open-loop gain;
   (d) receiving the amplified modulated carrier-frequency output signal;
   (e) producing a detected baseband feedback signal;
   (f) applying the detected baseband feedback signal to the input with the feedback loop; and
   (g) producing a gain and phase versus frequency characteristic that prevents instability in the linear amplifier by reducing the open-loop gain of the linear amplifier to a value lower than one for all frequencies where the feedback loop causes the phase of the baseband input signal to shift by more than 180 degrees.

10. A gain/phase compensation method for a linear amplifier, having an input, an output, and a feedback loop, comprising the steps of:
   (a) receiving inphase and quadrature baseband input signals at the input;
   (b) providing modulated carrier-frequency inphase and quadrature signals;
   (c) amplifying the modulated carrier-frequency inphase and quadrature signals, to produce an output signal;
   (d) receiving the carrier-frequency output signal;
   (e) producing detected baseband inphase and quadrature feedback signals;
   (f) applying the detected baseband inphase and quadrature feedback signals to the input through the feedback loop;
   (g) combining the inphase feedback signal, out of phase, with the inphase input signal, to provide an inphase difference signal;
   (h) combining the detected baseband quadrature feedback signal, out of phase, with the detected baseband quadrature input signal to provide a quadrature difference signal;
   (i) receiving the inphase and quadrature difference signal; and
   (j) producing a gain and phase versus frequency characteristics that prevents instability in the linear amplifier by reducing the open-loop gain of the linear amplifier to a value lower than one for all frequencies where the feedback loop causes the phase of the baseband input signal to shift by more than 180 degrees.

* * * * *

UNITED STATES PATENT AND TRADEMARK OFFICE
CERTIFICATE OF CORRECTION

PATENT NO. : 4,933,986

DATED : 6/12/90

INVENTOR(S) : LEITCH

It is certified that error appears in the above-identified patent and that said Letters Patent is hereby corrected as shown below:

In column 3, line 34, delete "baseboard" and insert --baseband--.

Signed and Sealed this

Seventh Day of April, 1992

Attest:

HARRY F. MANBECK, JR.

*Attesting Officer*   *Commissioner of Patents and Trademarks*